US005209816A

United States Patent [19]
Yu et al.

[11] Patent Number: 5,209,816
[45] Date of Patent: May 11, 1993

[54] METHOD OF CHEMICAL MECHANICAL POLISHING ALUMINUM CONTAINING METAL LAYERS AND SLURRY FOR CHEMICAL MECHANICAL POLISHING

[75] Inventors: Chris C. Yu; Trung T. Doan; Alan E. Laulusa, all of Boise, Id.

[73] Assignee: Micron Technology, Inc., Boise, Id.

[21] Appl. No.: 893,449

[22] Filed: Jun. 4, 1992

[51] Int. Cl.⁵ ............................................. H01L 21/00
[52] U.S. Cl. ....................................... 156/636; 156/657; 156/656; 437/225; 437/228; 51/165 R
[58] Field of Search .................. 156/636, 657, 656; 437/228, 225; 51/165 R

[56] References Cited

U.S. PATENT DOCUMENTS

| | | | |
|---|---|---|---|
| 4,116,714 | 9/1978 | Basi | 134/28 |
| 4,689,113 | 8/1987 | Balasubramanyam et al. | 156/657 |
| 4,789,648 | 12/1988 | Chow et al. | 437/228 |
| 4,944,836 | 7/1990 | Beyer et al. | 156/656 |
| 4,956,313 | 9/1990 | Cote | 437/228 |
| 4,992,135 | 2/1991 | Doan | 156/636 |
| 5,084,071 | 1/1992 | Nenadic et al. | 51/309 |

FOREIGN PATENT DOCUMENTS 49-74632  7/1974  Japan .

*Primary Examiner*—Brian E. Hearn
*Assistant Examiner*—Laura M. Holtzman
*Attorney, Agent, or Firm*—Wells, St. John, Roberts, Gregory & Matkin

[57] ABSTRACT

A semiconductor processing method of chemical mechanical polishing an aluminum containing metal layer on a semiconductor substrate includes, a) providing a chemical mechanical polishing slurry comprising $H_3PO_4$ at from about 0.1% to about 20% by volume; $H_2O_2$ at from about 1% to about 30% by volume, $H_2O$, and a solid abrasive material; and b) chemical mechanical polishing an aluminum containing metal layer on a semiconductor substrate with the slurry. Such process and slurry are also usable in chemical mechanical polishing of other layers, such as Ti, TiN and TiW materials. Such enables chemical mechanical polishing of a barrier metal/aluminum layer composite in a single polishing step, leading to increased controllability and resulting increased throughput. With respect to aluminum containing metal layers, the $H_2O_2$ is understood to cause oxidation to aluminum oxide, which is subsequently removed by both chemical and mechanical action the result of the polish and slurry. Oxidizing agents other than $H_2O_2$ are contemplated.

17 Claims, No Drawings

METHOD OF CHEMICAL MECHANICAL POLISHING ALUMINUM CONTAINING METAL LAYERS AND SLURRY FOR CHEMICAL MECHANICAL POLISHING

TECHNICAL FIELD

This invention relates to methods of chemical mechanical polishing aluminum containing metal layers and to slurries used in chemical mechanical polishing.

BACKGROUND OF THE INVENTION

Metal films are used in semiconductor technology to wire together various components formed on a semiconductor wafer. Metal in semiconductor processing can also be used to function as gate electrodes in MOS structures, and as electrodes in thin film capacitors. Elemental aluminum and its alloys have been the traditional metals utilized. Aluminum has emerged as the most important material for such applications because of its low resistivity, superior adhesion to $SiO_2$, ease of patterning, and high purity.

One technique of metal wiring comprises the patterning and etching of a trough and contact within a thick layer of insulating material, such as $SiO_2$. Thereafter, a thin layer of a barrier metal, such Ti, TiW or TiN, is provided atop the insulating layer and within the trough and contacts which leads to electrical connection sites which are elevationally lower within the wafer. The barrier metal functions to separate silicon from aluminum which will be deposited subsequently. After barrier metal deposition, a layer of elemental aluminum or an aluminum alloy is deposited to completely fill the trough and contacts. The trough, which was created prior to metal deposition, defines the desired metal patterning such that a planar metal removing technique down to the surface of the insulating layer will leave remaining desired patterned electrically conductive metal lines.

One such planarizing technique is chemical mechanical polishing. When chemical mechanical polishing is used to form metal lines by the above technique, it is referred to as a damascene process. However to date, chemical mechanical polishing of aluminum and its alloys has not been well understood or developed. Accordingly, a need remains for improved chemical mechanical polishing techniques and chemical mechanical polishing slurries for aluminum and its alloys, as well as other materials.

DETAILED DESCRIPTION OF A PREFERRED EMBODIMENT

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of chemical mechanical polishing an aluminum containing metal layer on a semiconductor substrate comprises:

providing a chemical mechanical polishing slurry comprising $H_3PO_4$ at from about 0.1% to about 20% by volume; $H_2O_2$ at from about 1% to about 30% by volume, $H_2O$, and a solid abrasive material; and chemical mechanical polishing an aluminum containing metal layer on a semiconductor substrate with the slurry.

In accordance with another aspect of the invention, a chemical mechanical polishing slurry for polishing an aluminum containing metal layer comprises:

$H_3PO_4$ at from about 0.1% to about 20% by volume; $H_2O_2$ at from about 1% to about 30% by volume, $H_2O$, and a solid abrasive material.

Such slurry material has also been discovered to facilitate chemical mechanical polishing of titanium containing layers, such as elemental titanium or TiN, and is expected to be utilizable in chemical mechanical polishing of still other materials. Preferably, the concentrations of $H_2O_2$ and $H_3PO_4$ in the slurry are from about 3% to about 9% by volume, and from about 3% to about 10% by volume, respectively. Also preferably, the $H_3PO_4$ is present at less than 6% by volume of the mixed slurry to minimize noxious fumes. Any suitable chemical mechanical polishing abrasive particles could be utilized in the slurry, such as alumina, silica or a titanium oxide.

The disclosed and claimed chemical mechanical polishing processes and slurry are understood to differ, at least in part, from other such processes and slurries in the combination of $H_2O_2$ and phosphoric acid. Such facilitates a planar removal mechanism of the metal which is understood to occur chemical in a chemical mechanical polishing technique as follows:

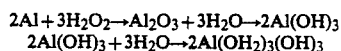
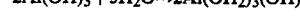

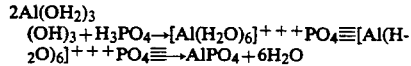

Hydrogen peroxide is understood to oxidize aluminum to a solid layer of $Al_2O_3$. This oxidized layer is then both chemically and mechanically removed by the combined action of, a) mechanical polishing, and b) phosphoric acid etching illustrated by the above equations which ultimately forms aqueous soluble $AlPO_4$. The above equations would seemingly indicate that $H_2O_2$ would be a good chemical etchant for aluminum, but this was not found to be so. Utilization of $H_2O_2$ alone or in the composition of the described and claimed slurry results in no appreciable removal of metal, absent the chemical mechanical polishing action.

It is well known that aluminum is a very soft material, and that scratches are easily generated on aluminum films during conventional, prior art chemical mechanical polishing processes. The formation of $Al_2O_3$ by the above reaction results in a material which is significantly harder than aluminum, and thereby substantially reduces or eliminates the amount of scratches which otherwise might be generated by a chemical mechanical polishing process.

Oxidizing agents other than $H_2O_2$ would also be useable in chemical mechanical polishing of an aluminum containing metal layer by the above oxide formation and removal technique. Accordingly in another aspect, the invention includes a semiconductor processing method of chemical mechanical polishing an aluminum containing metal layer on a semiconductor substrate comprising the following steps:

providing a chemical mechanical polishing slurry comprising $H_3PO_4$ at from about 0.1% to about 20% by volume; an oxidizing agent capable of oxidizing aluminum to aluminum oxide; $H_2O$; and a solid abrasive material;

applying the slurry onto an aluminum containing metal layer on a semiconductor substrate;

polishing the aluminum containing metal layer having the applied slurry;

reacting the aluminum of the metal layer with the oxidizing agent of the slurry to form aluminum oxide; and chemically and mechanically removing aluminum oxide from the wafer with the slurry and polishing action.

The invention was reduced to practice utilizing a commercial $H_3PO_4$ etching solution which comprised sixteen parts $H_3PO_4$, and one part each of $HNO_3$, $CH_3COOH$ and deionized water, by volume. This material was combined with water and alumina abrasive particles of a concentration of 2 gm/l to produce a 3.4% $H_3PO_4$ solution, by volume. A damascene construction filled and covered with an aluminum alloy of Al-Si(1%)-Cu(0.5%) was chemical mechanical polished on a polishing pad with such slurry, and resulted in a polishing rate from 0.5 to 0.9 KÅ/min. Under the same conditions, but utilizing the same solution with 6% $H_2O_2$ by volume substituted in place of an equivalent amount of $H_2O$, the polishing rate was significantly increased for 2.0 to 3.0 KÅ/min., and as well resulted in a scratch free polished Al-Si(1%)-Cu(0.5%) surface.

Such slurry has also been discovered to be utilizable in chemical mechanical polishing Ti and TiN layers at a significantly faster rate than where no $H_2O_2$ is present. Specifically, chemical mechanical polishing of Ti and TiN layers without $H_2O_2$ resulted in removal rates of 200 to 500 Å/min. When $H_2O_2$ was added to the same slurry and polishing was conducted under the same conditions, the removal rate increased to 1000 to 2000 Å/min. Accordingly, the described slurry enables a composite layer of elemental aluminum or an aluminum alloy and underlying barrier layer to be chemical mechanical polished within a single chemical mechanical polishing step, whereas most prior art processes would require multiple process steps for complete removal of the aluminum and barrier metal from the underlying insulating material.

In such a preferred process, the contact/vias and interconnect troughs would fir be etched into $SiO_2$, typically using a reactive ion etch. Thereafter, a barrier layer of Ti, TiN or TiW would be provided, such as by using a sputtering or chemical vapor deposition technique. Thereafter, an aluminum alloy, such as Al-Si(1%)-Cu(0.5%) or others, would be deposited, such as by chemical vapor deposition or sputtering. The subject slurry would then be utilized to chemical mechanical polish the alloy and barrier metal layer composite in a single step.

The utilization of $H_2O_2$ in the above-described manner for the barrier layer increases its polishing rate over that using $H_3PO_4$ alone to be very close to the chemical mechanical polishing rate of the aluminum alloy. Such results in enhanced controllability by minimizing or reducing the over polishing time required for clearing up any metal residue, thus improving throughput on the process. For example, with the described slurry, a 10,000 Angstrom (1 micron) thick aluminum layer can be completely polished in less than four minutes, thus increasing throughput. Utilizing an $H_3PO_4$ acid slurry alone, throughput was determined to only be six wafers per hour. Yet with the new process and slurry, the throughput was improved to 12 to 20 wafers per hours.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of chemical mechanical polishing an aluminum containing metal layer on a semiconductor substrate comprising the following steps:

providing a chemical mechanical polishing slurry comprising $H_3PO_4$ at from about 0.1% to about 20% by volume; $H_2O_2$ at from about 1% to about 30% by volume; $H_2O$; and a solid abrasive material; and chemical mechanical polishing an aluminum containing metal layer on a semiconductor substrate with the slurry.

2. The chemical mechanical polishing method of claim 1 wherein the slurry comprises $H_2O_2$ at from about 3% to about 9% by volume.

3. The chemical mechanical polishing method of claim 1 wherein the slurry comprises $H_3PO_4$ at from about 3% to about 10% by volume.

4. The chemical mechanical polishing method of claim 1 wherein the slurry comprises $H_2O_2$ at from about 3% to about 9% by volume, and $H_3PO_4$ at from about 3% to about 10% by volume.

5. A semiconductor processing method of chemical mechanical polishing an aluminum containing metal layer on a semiconductor substrate comprising the following steps:

providing a chemical mechanical polishing slurry comprising $H_3PO_4$ at from about 0.1% to about 20% by volume; $H_2O_2$ at from about 1% to about 30% by volume; $H_2O$; and a solid abrasive material;

applying the slurry onto an aluminum containing metal layer on a semiconductor substrate;

polishing the aluminum containing metal layer having the applied slurry;

reacting the aluminum of the metal layer with the $H_2O_2$ of the slurry to form aluminum oxide; and chemically and mechanically removing aluminum oxide from the wafer with the slurry and polishing action.

6. The chemical mechanical polishing method of claim 5 wherein the slurry comprises $H_2O_2$ at from about 3% to about 9% by volume.

7. The chemical mechanical polishing method of claim 5 wherein the slurry comprises $H_3PO_4$ at from about 3% to about 10% by volume.

8. The chemical mechanical polishing method of claim 5 wherein the slurry comprises $H_2O_2$ at from about 3% to about 9% by volume, and $H_3PO_4$ at from about 3% to about 10% by volume.

9. A semiconductor processing method of chemical mechanical polishing a layer on a semiconductor substrate, the layer comprising titanium, the method comprising the following steps:

providing a chemical mechanical polishing slurry comprising $H_3PO_4$ at from about 0.1% to about 20% by volume; $H_2O_2$ at from about 1% to about 30% by volume; $H_2O$; and a solid abrasive material; and chemical mechanical polishing a titanium containing layer on a semiconductor substrate with the slurry.

10. The chemical mechanical polishing method of claim 9 wherein the form of titanium of the titanium layer is selected from the group consisting of elemental titanium, TiN and TiW, or mixtures thereof.

11. The chemical mechanical polishing method of claim 9 wherein the slurry comprises $H_2O_2$ at from about 3% to about 9% by volume.

12. The chemical mechanical polishing method of claim 9 wherein the slurry comprises $H_3PO_4$ at from about 3% to about 10% by volume.

13. The chemical mechanical polishing method of claim 9 wherein the slurry comprises $H_2O_2$ at from about 3% to about 9% by volume, and $H_3PO_4$ at from about 35 to about 10% by volume.

14. A method of processing a semiconductor wafer comprising the following steps:

providing a barrier layer comprising titanium atop a semiconductor wafer;

providing a metal layer comprising aluminum atop the barrier layer;

providing a chemical mechanical polishing slurry comprising $H_3PO_4$ at from about 0.1% to about 20% by volume; $H_2O_2$ at from about 1% to about 30% by volume; $H_2O$; and a solid abrasive material; and chemical mechanical polishing the aluminum containing metal layer and barrier layer with the slurry in a single chemical mechanical polishing step.

15. The method of processing a semiconductor wafer of claim 14 wherein the slurry comprises $H_2O_2$ at from about 3% to about 9% by volume.

16. The method of processing a semiconductor wafer of claim 14 wherein the slurry comprises $H_3PO_4$ at from about 3% to about 10% by volume.

17. The method of processing a semiconductor wafer of claim 14 wherein the slurry comprises $H_2O_2$ at from about 3% to about 9% by volume, and $H_3PO_4$ at from about 3% to about 10% by volume.

* * * * *